US007979263B2

(12) United States Patent
Master et al.

(10) Patent No.: US 7,979,263 B2
(45) Date of Patent: Jul. 12, 2011

(54) METHOD, SYSTEM AND PROGRAM FOR DEVELOPING AND SCHEDULING ADAPTIVE INTEGRATED CIRCUITRY AND CORRESPONDING CONTROL OR CONFIGURATION INFORMATION (75) Inventors: Paul L. Master, Sunnyvale, CA (US); Eugene Hogenauer, San Carlos, CA (US); Bicheng William Wu, Union City, CA (US); Dan MingLun Chuang, San Jose, CA (US); Bjorn Freeman Benson, Seattle, WA (US)

(73) Assignee: QST Holding, LLC, Palo Alto, CA (US)

( * ) Notice: Subject to any disclaimer, the term of this patent is extended or adjusted under 35 U.S.C. 154(b) by 0 days.

(21) Appl. No.: 12/350,618

(22) Filed: Jan. 8, 2009

(65) Prior Publication Data
US 2009/0119480 A1 May 7, 2009

Related U.S. Application Data (63) Continuation of application No. 10/289,639, filed on Nov. 7, 2002, now Pat. No. 7,478,031.

(51) Int. Cl.
G06F 9/45 (2006.01)
(52) U.S. Cl. .............................. 703/22; 703/14; 713/100
(58) Field of Classification Search .................... 703/13, 703/14, 22; 717/160, 136; 326/41; 713/189, 713/100, 168; 712/227, 29, 15, 28; 709/220, 709/102; 375/148; 455/74; 718/102
See application file for complete search history.

(56) References Cited

U.S. PATENT DOCUMENTS

| 6,836,839 B2* | 12/2004 | Master et al. | 712/29 |
| 2002/0138716 A1* | 9/2002 | Master et al. | 712/227 |
| 2002/0181559 A1* | 12/2002 | Heidari-Bateni et al. | 375/148 |
| 2002/0184291 A1* | 12/2002 | Hogenauer | 709/102 |
| 2003/0054774 A1* | 3/2003 | Plunkett et al. | 455/74 |
| 2003/0102889 A1* | 6/2003 | Master et al. | 326/41 |
| 2003/0105949 A1* | 6/2003 | Master et al. | 713/100 |
| 2003/0126450 A1* | 7/2003 | Master et al. | 713/189 |
| 2003/0140123 A1* | 7/2003 | Master et al. | 709/220 |
| 2003/0154357 A1* | 8/2003 | Master et al. | 712/15 |
| 2003/0200538 A1* | 10/2003 | Ebeling et al. | 717/160 |
| 2004/0093589 A1* | 5/2004 | Master | 717/136 |
| 2004/0093601 A1* | 5/2004 | Master et al. | 718/102 |
| 2005/0091472 A1* | 4/2005 | Master et al. | 712/15 |
| 2006/0031660 A1* | 2/2006 | Master et al. | 712/15 |
| 2006/0080532 A1* | 4/2006 | Master et al. | 713/168 |
| 2007/0118762 A1* | 5/2007 | Master et al. | 713/189 |

(Continued)

Primary Examiner — Paul L Rodriguez
Assistant Examiner — Kandasamy Thangavelu
(74) Attorney, Agent, or Firm — Nixon Peabody LLP (57) ABSTRACT A method, system and program are provided for development of an adaptive computing integrated circuit and corresponding configuration information, in which the configuration information provides an operating mode to the adaptive computing integrated circuit. The exemplary system includes a scheduler, a memory, and a compiler. The scheduler is capable of scheduling a selected algorithm with a plurality of adaptive computing descriptive objects to produce a scheduled algorithm and a selected adaptive computing circuit version. The memory is utilized to store the plurality of adaptive computing descriptive objects and a plurality of adaptive computing circuit versions generated during the scheduling process. The selected adaptive computing circuit version is converted into a hardware description language, for fabrication into the adaptive computing integrated circuit. The compiler generates the configuration information, from the scheduled algorithm and the selected adaptive computing circuit version, for the performance of the algorithm by the adaptive computing integrated circuit. In the exemplary embodiments, multiple versions of configuration information may be generated, for different circuit versions, different feature sets, different operating conditions, and different operating modes.

10 Claims, 4 Drawing Sheets

U.S. PATENT DOCUMENTS

2008/0098095 A1* 4/2008 Master et al. .................. 709/220
2008/0098203 A1* 4/2008 Master et al. .................. 712/28
2008/0209167 A1* 8/2008 Master et al. .................. 712/29
2009/0037691 A1* 2/2009 Master et al. .................. 712/15
2009/0037692 A1* 2/2009 Master et al. .................. 712/15
2009/0037693 A1* 2/2009 Master et al. .................. 712/15

\* cited by examiner

FIG. 1
ADAPTIVE COMPUTING ENGINE (ACE)

METHOD, SYSTEM AND PROGRAM FOR DEVELOPING AND SCHEDULING ADAPTIVE INTEGRATED CIRCUITRY AND CORRESPONDING CONTROL OR CONFIGURATION INFORMATION

This application is a continuation of U.S. Pat. No. 7,478,031 which was filed on Nov. 7, 2002 as application Ser. No. 10/289,639. The contents of that application are incorporated by reference herein.

CROSS-REFERENCE TO RELATED APPLICATIONS

This application is related to Paul L. Master et al., U.S. patent application Ser. No. 09/815,122, entitled "Adaptive Integrated Circuitry With Heterogeneous And Reconfigurable Matrices Of Diverse And Adaptive Computational Units Having Fixed, Application Specific Computational Elements", filed Mar. 22, 2001, commonly assigned to QuickSilver Technology, Inc., and incorporated by reference herein, with priority claimed for all commonly disclosed subject matter (the "first related application").

This application is also related to Eugene Hogenauer, U.S. patent application Ser. No. 09/872,397, entitled "Method and System for Scheduling in an Adaptable Computing Engine", filed May 31, 2001, commonly assigned to QuickSilver Technology, Inc., and incorporated by reference herein, with priority claimed for all commonly disclosed subject matter (the "second related application").

This application is further related to Paul L. Master et al., U.S. patent application Ser. No. 09/997,987, entitled "Apparatus, Method, System and Executable Module For Configuration and Operation Of Adaptive Integrated Circuitry Having Fixed, Application Specific Computational Elements", filed Nov. 30, 2001, commonly assigned to QuickSilver Technology, Inc., and incorporated by reference herein, with priority claimed for all commonly disclosed subject matter (the "third related application").

FIELD OF THE INVENTION

The present invention relates, in general, to integrated circuits and systems of integrated circuits. More particularly, the present invention relates to a method, system and program for developing and scheduling adaptive integrated circuitry having fixed, application specific computational elements and also corresponding control or configuration information.

BACKGROUND OF THE INVENTION

The first related application discloses a new form or type of integrated circuitry which effectively and efficiently combines and maximizes the various advantages of processors, application specific integrated circuits ("ASICs"), and field programmable gate arrays ("FPGAs"), while minimizing potential disadvantages. The first related application illustrates a new form or type of integrated circuit ("IC"), referred to as an adaptive computing engine ("ACE"), which provides the programming flexibility of a processor, the post-fabrication flexibility of FPGAs, and the high speed and high utilization factors of an ASIC. This ACE integrated circuitry is readily reconfigurable or adaptive, in advance, in real-time or potentially slower, is capable of having corresponding, multiple modes of operation, and further minimizes power consumption while increasing performance, with particular suitability for low power applications, such as for use in handheld and other battery-powered devices.

The adaptive computing engine ("ACE") circuit of the first related application, for adaptive or reconfigurable computing, includes a plurality of heterogeneous computational elements coupled to an interconnection network, rather than the homogeneous units of FPGAs. The plurality of heterogeneous computational elements include corresponding computational elements having fixed and differing architectures, such as fixed architectures for different functions such as memory, addition, multiplication, complex multiplication, subtraction, configuration, reconfiguration, control, input, output, and field programmability. In response to configuration information, the interconnection network is operative in real-time or potentially slower to adapt and re-adapt (configure and reconfigure) the plurality of heterogeneous computational elements for a plurality of different functional modes, including linear algorithmic operations, non-linear algorithmic operations, finite state machine operations, memory operations, and bit-level manipulations. In turn, this configuration and reconfiguration of heterogeneous computational elements, forming various computational units and adaptive matrices (or adaptive nodes), in real-time or across time, generates the selected operating mode of the ACE integrated circuit, for the performance of a wide variety of tasks.

This ACE integrated circuit, as indicated above, is controlled by a series or sequence of bits, referred to as "configuration information", which generates the configurations and reconfigurations which provide and create one or more operating modes for the ACE circuit, such as wireless communication, radio reception, personal digital assistance ("PDA"), MP3 music playing, or other desired functions.

Current system development tools, typically embodied as computer programs, do not address the particular needs and difficulties of designing ACE circuitry, and developing and scheduling configuration information to allow the ACE IC to perform a selected operating mode. As a consequence, a need remains for a suite of development tools which may design and develop ACE circuitry, adapt one or more algorithms for performance on ACE circuitry, schedule a selected algorithm for execution on selected ACE computational elements, and generate a bit file (as configuration information) for control of the ACE circuitry for the selected operating mode.

SUMMARY OF THE INVENTION

The present invention provides a method, system and program for development of an adaptive computing integrated circuit and corresponding configuration information, in which the configuration information provides an operating mode to the adaptive computing integrated circuit.

The exemplary method (and program) begins with selecting an algorithm for performance by the adaptive computing integrated circuit, such as one or more algorithms which may be used in mobile communications, for example. The algorithm also may be profiled for performance on the adaptive computing integrated circuit.

A plurality of adaptive computing descriptive objects ("ADOs") are then determined. In general, an ADO includes a description of a function, the I/O for the function, a description of a memory resource for the function, the I/O for the memory resource, and a connection between the function and the memory resource. The types of functions which may form an ADO include linear operations, such as addition and multiplication; non-linear operations such as discrete cosine transformation; finite state machine operations; control sequences; bit level manipulations; memory, and memory management.

The method and system then schedule the algorithm with the plurality of adaptive computing descriptive objects to produce a scheduled algorithm and a selected adaptive computing circuit version. Preferably, this includes generating a plurality of adaptive computing circuit versions from the plurality of adaptive computing descriptive objects; scheduling the algorithm with the plurality of adaptive computing descriptive objects of each of the plurality of adaptive computing circuit versions; and using a selection parameter of a plurality of selection parameters, selecting an adaptive computing circuit version, of the plurality of adaptive computing circuit versions, to form the selected adaptive computing circuit version. The plurality of selection parameters, in general, include power consumption, speed of operation, latency, bandwidth requirements, a competing operating mode, and versatility for a plurality of operating modes.

The selected adaptive computing circuit version is converted to a hardware description language for subsequent fabrication to form the adaptive computing integrated circuit. From the scheduled algorithm and the selected adaptive computing circuit version, the method and system generate the configuration information for the performance of the algorithm by the adaptive computing integrated circuit. In the exemplary embodiment, the configuration information is compiled into an adaptive computing integrated circuit bit file, for loading into the adaptive computing integrated circuit.

In the exemplary embodiment, a plurality of versions (or libraries) of configuration information are generated, with each configuration information version corresponding to a selection parameter of a plurality of selection parameters. The plurality of selection parameters include a competing operating mode, versatility for a plurality of operating modes, a selected operational feature set of a plurality of operational feature sets, selected operating conditions of a plurality of operating conditions, and a selected adaptive computing circuit version of a plurality of adaptive computing circuit versions.

This capability for numerous configuration information versions or libraries creates significant versatility for the adaptive computing integrated circuit, for one or more selected operating modes, different hardware versions, different feature sets, different operating conditions, and pre-existing operating modes. An entire library or database of these versions of configuration information may be created in advance or in real time, for each of these different considerations. In addition, additional versions may also be created for different operating conditions, such as power consumption, latency, speed of operation, and bandwidth considerations. A library of such versions (as "multiple binaries") may be stored in multiple locations, such as on a network server, for download into a given adaptive computing circuit by a corresponding service provider.

All of the various processes of the present invention may run off a single set of descriptions, the adaptive computing descriptive objects (or ADOs), for any number of different operating modes, with corresponding algorithms bound to the hardware through the scheduling process.

Numerous other advantages and features of the present invention will become readily apparent from the following detailed description of the invention and the embodiments thereof, from the claims and from the accompanying drawings.

BRIEF DESCRIPTION OF THE DRAWINGS

The foregoing and other objects, features and advantages of the present invention will be more readily appreciated upon reference to the following disclosure when considered in conjunction with the accompanying drawings, in which.

DETAILED DESCRIPTION OF THE INVENTION

While the present invention is susceptible of embodiment in many different forms, there are shown in the drawings and will be described herein in detail specific embodiments thereof, with the understanding that the present disclosure is to be considered as an exemplification of the principles of the invention and is not intended to limit the invention to the specific embodiments illustrated.

As indicated above, a need remains for a method, program and system to design an ACE circuit, including determining the type, number, placement, and matrix interconnection network ("MIN") routing of or for computational units 200 and computational elements 250, for subsequent fabrication into an integrated circuit. Similarly, how such computational units 200 and computational elements 250 are to be configured and reconfigured to perform a given task must also be determined. In accordance with the present invention, these two sets of tasks occur approximately jointly and interactively, optimizing the IC for a plurality of functions and operating modes. In addition, the present invention enables further IC optimization for speed, size, utilization factors, and power consumption, with additional emphasis on enabling concurrent or parallel computing across multiple computational units 200 and computational elements 250.

In the following discussion, the adaptive integrated circuit (ACE) is described in detail with reference to FIGS. 1 and 2, to provide a foundation for the description of the present invention. Following the description of the ACE IC, the present invention is described, as a method embodiment (FIG. 3) and as a system embodiment (FIG. 4). It should also be understood that, while explained with reference to the ACE architecture, the methodology and systems of the present invention are also applicable to any other adaptive computing architecture which utilize a plurality of different computational elements.

Figure 1:
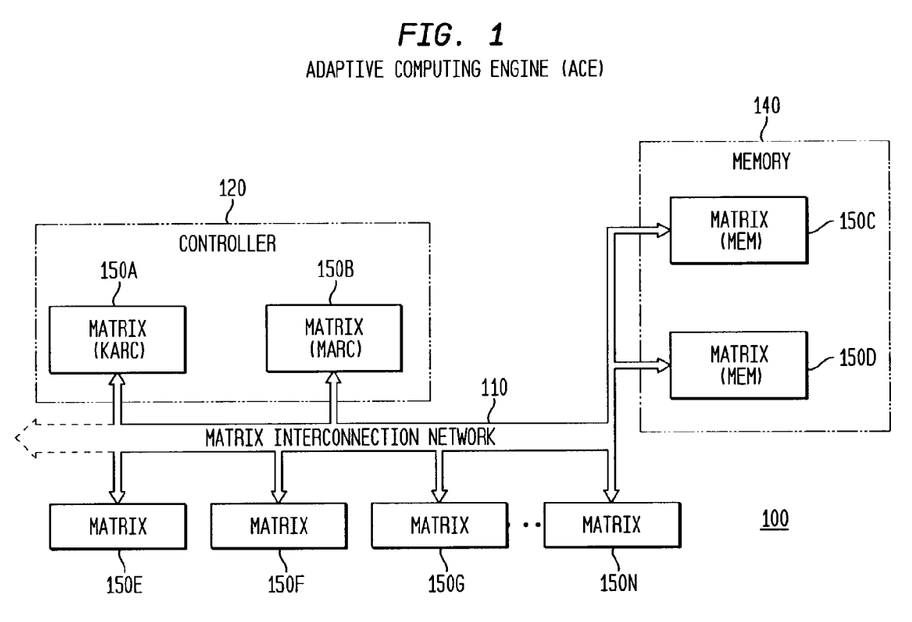
FIG. 1 is a block diagram illustrating an exemplary adaptive computing engine (ACE) embodiment in accordance with the invention of the first related application.

FIG. 1 is a block diagram illustrating an exemplary adaptive computing circuit, referred to as an adaptive computing engine (ACE) 100, which is preferably embodied as an integrated circuit, or as a portion of an integrated circuit having other, additional components. (The ACE 100 is also described in detail in the first related application.) In the exemplary embodiment, and as discussed in greater detail below, the ACE 100 includes one or more reconfigurable matrices (or nodes) 150, such as matrices 150A through 150N as illustrated, and a matrix interconnection network (MIN) 110. Also in the exemplary embodiment, and as discussed in detail below, one or more of the matrices 150, such as matrices 150A and 150B, are configured for functionality as a controller 120, while other matrices, such as matrices 150C and 150D, are configured for functionality as a memory 140. While illustrated as separate matrices 150A through 150D, it should be noted that these control and memory functionalities may be, and preferably are, distributed across a plurality of matrices 150 having additional functions to, for example, avoid any processing or memory "bottlenecks" or other limitations. The various matrices 150 and matrix interconnection network 110 may also be implemented together as fractal subunits, which may be scaled from a few nodes to thousands of nodes. Depending upon the selected embodiment, a processor (such as a microprocessor or digital signal processor ("DSP")) may be included with the ACE 100 in a larger apparatus or system embodiment, and when so included, is preferably a reduced instruction set (RISC) processor.

A significant departure from the prior art, the ACE 100 does not utilize traditional (and typically separate) data, direct memory access (DMA), random access, configuration and instruction busses for signaling and other transmission between and among the reconfigurable matrices 150, the controller 120, and the memory 140, or for other input/output ("I/O") functionality. Rather, data, control and configuration information are transmitted between and among these matrix 150 elements, utilizing the matrix interconnection network 110, which may be configured and reconfigured, to provide any given connection between and among the reconfigurable matrices 150, including those matrices 150 configured as the controller 120 and the memory 140, as discussed in greater detail below.

It should also be noted that once configured, the MIN 110 also and effectively functions as a memory, directly providing the interconnections for particular functions, until and unless it is reconfigured. In addition, such configuration and reconfiguration may occur in advance of the use of a particular function or operation, and/or may occur in real-time or at a slower rate, namely, in advance of, during or concurrently with the use of the particular function or operation. Such configuration and reconfiguration, moreover, may be occurring in a distributed fashion without disruption of function or operation, with computational elements in one location being configured while other computational elements (having been previously configured) are concurrently performing their designated function. This configuration flexibility of the ACE 100 contrasts starkly with FPGA reconfiguration, both which generally occurs comparatively slowly, not in real-time or concurrently with use, and which must be completed in its entirety prior to any operation or other use.

The matrices 150 configured to function as memory 140 may be implemented in any desired or preferred way, utilizing computational elements (discussed below) of fixed memory elements, and may be included within the ACE 100 or incorporated within another IC or portion of an IC. In the exemplary embodiment, the memory 140 is included within the ACE 100, and preferably is comprised of computational elements which are low power consumption random access memory (RAM), but also may be comprised of computational elements of any other form of memory, such as flash, DRAM, SRAM, SDRAM, MRAM, FeRAM, ROM, EPROM or $E^2$PROM. As mentioned, this memory functionality may also be distributed across multiple matrices 150, and may be temporally embedded, at any given time, as a particular MIN 110 configuration. In addition, in the exemplary embodiment, the memory 140 preferably includes direct memory access (DMA) engines, not separately illustrated.

The controller 120 is preferably implemented, using matrices 150A and 150B configured as adaptive finite state machines, as a reduced instruction set ("RISC") processor, controller or other device or IC capable of performing the two types of functionality discussed below. The first control functionality, referred to as "kernel" control, is illustrated as kernel controller ("KARC") of matrix 150A, and the second control functionality, referred to as "matrix" control, is illustrated as matrix controller ("MARC") of matrix 150B.

Figure 2:
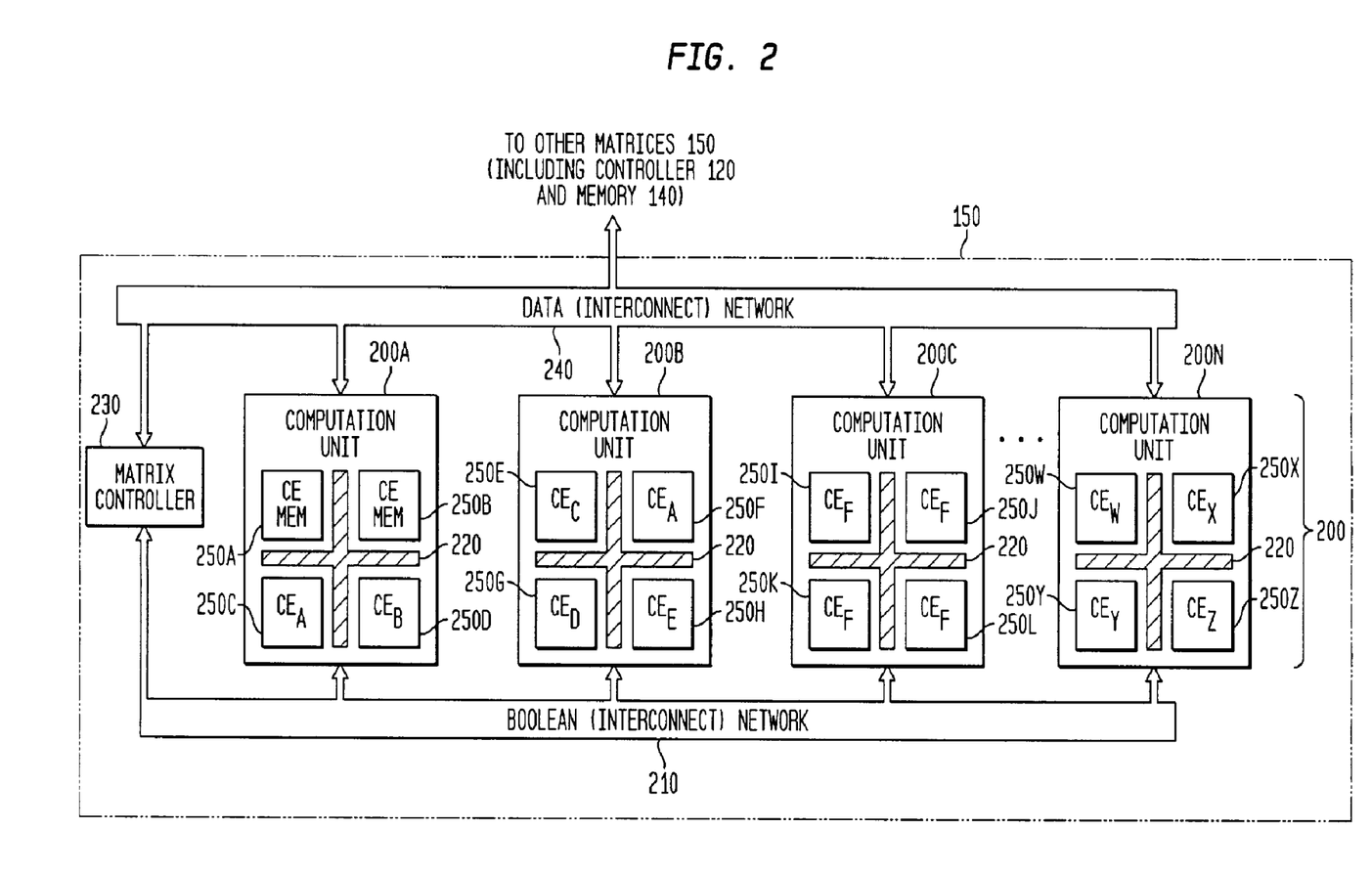
FIG. 2 is a block diagram illustrating a reconfigurable matrix, a plurality of computation units, and a plurality of computational elements, in accordance with the invention of the first related application.

The matrix interconnection network 110 of FIG. 1, and its subset interconnection networks separately illustrated in FIG. 2 (Boolean interconnection network 210, data interconnection network 240, and interconnect 220), collectively and generally referred to herein as "interconnect", "interconnection(s)", "interconnection network(s)" or MIN, provide selectable (or switchable) connections between and among the controller 120, the memory 140, the various matrices 150, and the computational units 200 and computational elements 250 discussed below, providing the physical basis for the configuration and reconfiguration referred to herein, in response to and under the control of configuration signaling generally referred to herein as "configuration information". In addition, the various interconnection networks (110, 210, 240 and 220) provide selectable, routable or switchable data, input, output, control and configuration paths, between and among the controller 120, the memory 140, the various matrices 150, and the computational units 200 and computational elements 250, in lieu of any form of traditional or separate input/output busses, data busses, DMA, RAM, configuration and instruction busses.

The various matrices or nodes 150 are reconfigurable and heterogeneous, namely, in general, and depending upon the desired configuration: reconfigurable matrix 150A is generally different from reconfigurable matrices 150B through 150N; reconfigurable matrix 150B is generally different from reconfigurable matrices 150A and 150C through 150N; reconfigurable matrix 150C is generally different from reconfigurable matrices 150A, 150B and 150D through 150N, and so on. The various reconfigurable matrices 150 each generally contain a different or varied mix of adaptive and reconfigurable computational (or computation) units (200, FIG. 2); the computational units 200, in turn, generally contain a different or varied mix of fixed, application specific computational elements (250, FIG. 2), which may be adaptively connected, configured and reconfigured in various ways to perform varied functions, through the various interconnection networks. In addition to varied internal configurations and reconfigurations, the various matrices 150 may be connected, configured and reconfigured at a higher level, with respect to each of the other matrices 150, through the matrix interconnection network 110.

The ACE architecture utilizes a plurality of fixed and differing computational elements, such as (without limitation) correlators, multipliers, complex multipliers, adders, demodulators, interconnection elements, routing elements, combiners, finite state machine elements, reduced instruction set (RISC) processing elements, bit manipulation elements, input/output (I/O) and other interface elements, and the lower-level "building blocks" which form these units, which may be configured and reconfigured, in response to configuration information, to form the functional blocks (computational units and matrices) which may be needed, at any given or selected time, to perform higher-level functions and, ultimately, to execute or perform the selected operating mode, such as to perform wireless communication functionality, including channel acquisition, voice transmission, multimedia and other data processing. Through the varying levels of interconnect, corresponding algorithms are then implemented, at any given time, through the configuration and reconfiguration of fixed computational elements (250), namely, implemented within hardware which has been optimized and configured for efficiency, i.e., a "machine" is configured in real-time which is optimized to perform the particular algorithm.

Next, the present invention also utilizes a tight coupling (or interdigitation) of data and configuration (or other control) information, within one, effectively continuous stream of information. This coupling or commingling of data and configuration information, referred to as "silverware" or as a "silverware" module, is the subject of the third related application. For purposes of the present invention, however, it is sufficient to note that this coupling of data and configuration information into one information (or bit) stream, which may be continuous or divided into packets, helps to enable real-time reconfigurability of the ACE 100, without a need for the (often unused) multiple, overlaying networks of hardware interconnections of the prior art. For example, as an analogy, a particular, first configuration of computational elements at a particular, first period of time, as the hardware to execute a corresponding algorithm during or after that first period of time, may be viewed or conceptualized as a hardware analog of "calling" a subroutine in software which may perform the same algorithm. As a consequence, once the configuration of the computational elements has occurred (i.e., is in place), as directed by (a first subset of) the configuration information, the data for use in the algorithm is immediately available as part of the silverware module. The same computational elements may then be reconfigured for a second period of time, as directed by second configuration information (i.e., a second subset of configuration information), for execution of a second, different algorithm, also utilizing immediately available data. The immediacy of the data, for use in the configured computational elements, provides a one or two clock cycle hardware analog to the multiple and separate software steps of determining a memory address and fetching stored data from the addressed registers. This has the further result of additional efficiency, as the configured computational elements may execute, in comparatively few clock cycles, an algorithm which may require orders of magnitude more clock cycles for execution if called as a subroutine in a conventional microprocessor or DSP.

This use of silverware modules, as a commingling of data and configuration information, in conjunction with the reconfigurability of a plurality of heterogeneous and fixed computational elements 250 to form adaptive, different and heterogeneous computation units 200 and matrices 150, enables the ACE 100 architecture to have multiple and different modes of operation. For example, when included within a hand-held device, given a corresponding silverware module, the ACE 100 may have various and different operating modes as a cellular or other mobile telephone, a music player, a pager, a personal digital assistant, and other new or existing functionalities. In addition, these operating modes may change based upon the physical location of the device. For example, while configured for a first operating mode, using a first set of configuration information, as a CDMA mobile telephone for use in the United States, the ACE 100 may be reconfigured using a second set of configuration information for an operating mode as a GSM mobile telephone for use in Europe.

Referring again to FIG. 1, the functions of the controller 120 (preferably matrix (KARC) 150A and matrix (MARC) 150B, configured as finite state machines) may be explained: (1) with reference to a silverware module, namely, the tight coupling of data and configuration information within a single stream of information; (2) with reference to multiple potential modes of operation; (3) with reference to the reconfigurable matrices 150; and (4) with reference to the reconfigurable computation units 200 and the computational elements 250 illustrated in FIG. 2. As indicated above, through a silverware module, the ACE 100 may be configured or reconfigured to perform a new or additional function, such as an upgrade to a new technology standard or the addition of an entirely new function, such as the addition of a music function to a mobile communication device. Such a silverware module may be stored in the matrices 150 of memory 140, or may be input from an external (wired or wireless) source through, for example, matrix interconnection network 110. In the exemplary embodiment, one of the plurality of matrices 150 is configured to decrypt such a module and verify its validity, for security purposes. Next, prior to any configuration or reconfiguration of existing ACE 100 resources, the controller 120, through the matrix (KARC) 150A, checks and verifies that the configuration or reconfiguration may occur without adversely affecting any pre-existing functionality, such as whether the addition of music functionality would adversely affect pre-existing mobile communications functionality. In the exemplary embodiment, the system requirements for such configuration or reconfiguration are included within the silverware module or configuration information, for use by the matrix (KARC) 150A in performing this evaluative function. If the configuration or reconfiguration may occur without such adverse affects, the silverware module is allowed to load into the matrices 150 (of memory 140), with the matrix (KARC) 150A setting up the DMA engines within the matrices 150C and 150D of the memory 140 (or other stand-alone DMA engines of a conventional memory). If the configuration or reconfiguration would or may have such adverse affects, the matrix (KARC) 150A does not allow the new module to be incorporated within the ACE 100.

Continuing to refer to FIG. 1, the matrix (MARC) 150B manages the scheduling of matrix 150 resources, clocking, and the timing of any corresponding data, to synchronize any configuration or reconfiguration of the various computational elements 250 and computation units 200 with any corresponding input data and output data. In the exemplary embodiment, timing or other clocking information is also included within a silverware module or, more generally, within configuration information, to allow the matrix (MARC) 150B through the various interconnection networks to direct a reconfiguration of the various matrices 150 in time, and preferably just in time, for the reconfiguration to occur before corresponding data has appeared at any inputs of the various reconfigured computation units 200. In addition, the matrix (MARC) 150B may also perform any residual processing which has not been accelerated within any of the various matrices 150. As a consequence, the matrix (MARC) 150B may be viewed as a control unit which "calls" the configurations and reconfigurations of the matrices 150, computation units 200 and computational elements 250, in real-time, in synchronization with any corresponding data to be utilized by these various reconfigurable hardware units, and which performs any residual or other control processing. Other matrices 150 may also include this control functionality, with any given matrix 150 capable of calling and controlling a configuration and reconfiguration of other matrices 150.

FIG. 2 is a block diagram illustrating, in greater detail, a reconfigurable matrix 150 with a plurality of computation units 200 (illustrated as computation units 200A through 200N), and a plurality of computational elements 250 (illustrated as computational elements 250A through 250Z), and provides additional illustration of the exemplary types of computational elements 250. As illustrated in FIG. 2, any matrix 150 generally includes a matrix controller 230, a plurality of computation (or computational) units 200, and as logical or conceptual subsets or portions of the matrix interconnect network 110, a data interconnect network 240 and a Boolean interconnect network 210. As mentioned above, in the exemplary embodiment, at increasing "depths" within the ACE 100 architecture, the interconnect networks become increasingly rich, for greater levels of adaptability and reconfiguration. The Boolean interconnect network 210, also as mentioned above, provides the reconfiguration and data interconnection capability between and among the various computation units 200, and is preferably small (i.e., only a few bits wide), while the data interconnect network 240 provides the reconfiguration and data interconnection capability for data input and output between and among the various computation units 200, and is preferably comparatively large (i.e., many bits wide). It should be noted, however, that while conceptually divided into reconfiguration and data capabilities, any given physical portion of the matrix interconnection network 110, at any given time, may be operating as either the Boolean interconnect network 210, the data interconnect network 240, the lower level interconnect 220 (between and among the various computational elements 250), or other input, output, configuration, or connection functionality.

Continuing to refer to FIG. 2, included within a computation unit 200 are a plurality of computational elements 250, illustrated as computational elements 250A through 250Z (individually and collectively referred to as computational elements 250), and additional interconnect 220. The interconnect 220 provides the reconfigurable interconnection capability and input/output paths between and among the various computational elements 250. As indicated above, each of the various computational elements 250 consist of dedicated, application specific hardware designed to perform a given task or range of tasks, resulting in a plurality of different, fixed computational elements 250. Utilizing the interconnect 220, the fixed computational elements 250 may be reconfigurably connected together into adaptive and varied computational units 200, which also may be further reconfigured and interconnected, to execute an algorithm or other function, at any given time, utilizing the interconnect 220, the Boolean network 210, and the matrix interconnection network 110. While illustrated with effectively two levels of interconnect (for configuring computational elements 250 into computational units 200, and in turn, into matrices 150), for ease of explanation, it should be understood that the interconnect, and corresponding configuration, may extend to many additional levels within the ACE 100. For example, utilizing a tree concept, with the fixed computational elements analogous to leaves, a plurality of levels of interconnection and adaptation are available, analogous to twigs, branches, boughs, limbs, trunks, and so on, without limitation.

In the exemplary embodiment, the various computational elements 250 are designed and grouped together, into the various adaptive and reconfigurable computation units 200. In addition to computational elements 250 which are designed to execute a particular algorithm or function, such as multiplication, correlation, clocking, synchronization, queuing, sampling, or addition, other types of computational elements 250 are also utilized in the exemplary embodiment. As illustrated in FIG. 2, computational elements 250A and 250B implement memory, to provide local memory elements for any given calculation or processing function (compared to the more "remote" memory 140). In addition, computational elements 250I, 250J, 250K and 250L are configured to implement finite state machines, to provide local processing capability (compared to the more "remote" matrix (MARC) 150B), especially suitable for complicated control processing.

With the various types of different computational elements 250 which may be available, depending upon the desired functionality of the ACE 100, the computation units 200 may be loosely categorized. A first category of computation units 200 includes computational elements 250 performing linear operations, such as multiplication, addition, finite impulse response filtering, clocking, synchronization, and so on. A second category of computation units 200 includes computational elements 250 performing non-linear operations, such as discrete cosine transformation, trigonometric calculations, and complex multiplications. A third type of computation unit 200 implements a finite state machine, such as computation unit 200C as illustrated in FIG. 2, particularly useful for complicated control sequences, dynamic scheduling, and input/output management, while a fourth type may implement memory and memory management, such as within computation unit 200A. A fifth type of computation unit 200 may be included to perform bit-level manipulation, such as for encryption, decryption, channel coding, Viterbi decoding, and packet and protocol processing (such as Internet Protocol processing). In addition, another (sixth) type of computation unit 200 may be utilized to extend or continue any of these concepts, such as bit-level manipulation or finite state machine manipulations, to increasingly lower levels within the ACE 100 architecture.

In the exemplary embodiment, in addition to control from other matrices or nodes 150, a matrix controller 230 may also be included or distributed within any given matrix 150, also to provide greater locality of reference and control of any reconfiguration processes and any corresponding data manipulations. For example, once a reconfiguration of computational elements 250 has occurred within any given computation unit 200, the matrix controller 230 may direct that that particular instantiation (or configuration) remain intact for a certain period of time to, for example, continue repetitive data processing for a given application.

As may be apparent from the discussion above, the design of an adaptive computing circuit, such as an ACE 100 circuit, including determining the type, number, placement, and MIN routing of or for computational units 200 and computational elements 250, for subsequent fabrication into an integrated circuit, may be a daunting task. Similarly, how such computational units 200 and computational elements 250 are to be configured and reconfigured to perform a given task must also be determined. In accordance with the present invention, these two sets of tasks occur approximately jointly and interactively, optimizing the adaptive computing IC for a plurality of functions and operating modes. In addition, the present invention enables further IC optimization for speed, size, utilization factors, and power consumption, with additional emphasis on enabling concurrent or parallel computing across multiple computational units 200 and computational elements 250. (It should be noted that optimization is used herein in a very broad sense, to mean and include merely desired or acceptable for one or more purposes, for example, and not just meaning "most" desired or favorable.)

Figure 3:
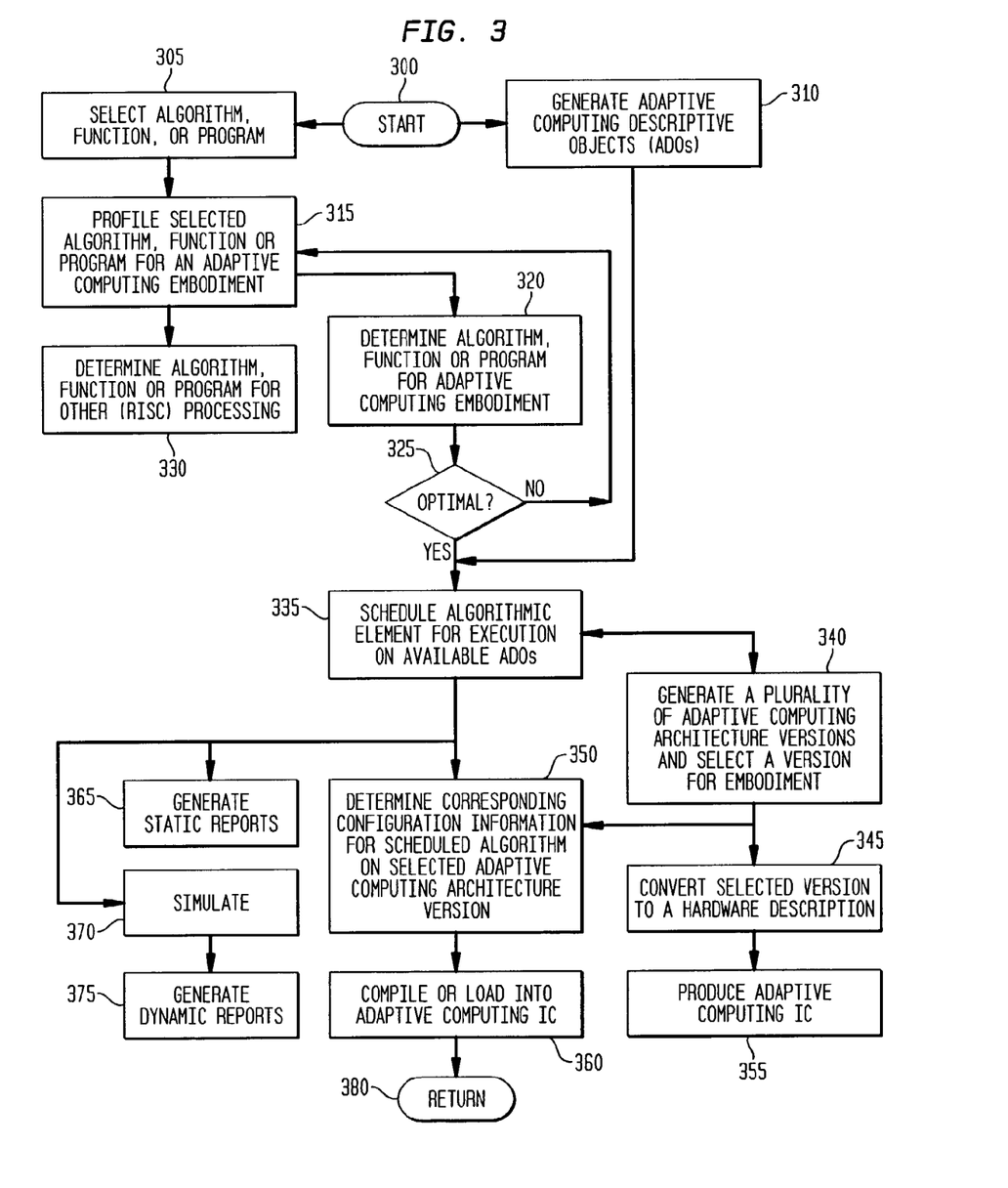
FIG. 3 is a flow diagram illustrating an exemplary method embodiment in accordance with the present invention.
Figure 4:
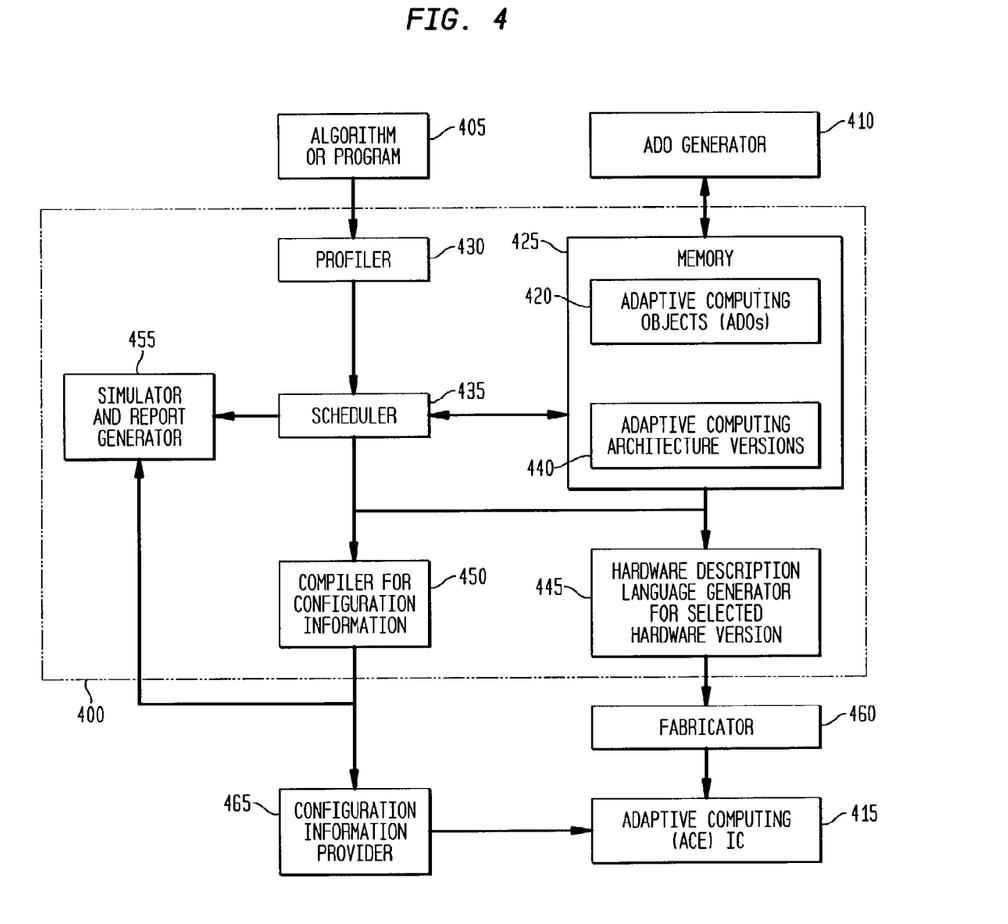
FIG. 4 is a block diagram illustrating an exemplary system embodiment in accordance with the present invention.

FIG. 3 is a flow diagram illustrating an exemplary method embodiment, for developing and scheduling both adaptive integrated circuitry having fixed, application specific computational elements and corresponding control or configuration information, in accordance with the present invention. Beginning with a start step 300, the exemplary method proceeds along two separate, and initially independent, paths, with the first path being focused upon the desired or selected algorithms, functions or programs for execution (steps 305, 315-325), and the second path being focused upon the development of the hardware (or IC) aspects of the adaptive computing integrated circuit (steps 310 and 340). The end result of this process, as discussed in greater detail below, will be an adaptive computing circuit design and corresponding configuration information (as a bit file or sequence) to control the adaptive computing circuit and allow it to execute its selected operating mode.

As a consequence, the method proceeds to step 305, to select or generate the desired algorithm, function or program. Preferably jointly, the method also proceeds to generate one or more descriptions of a plurality of computational elements 250 and computational units 200, step 310, preferably as hardware descriptions, to form "objects" referred to as adaptive computing (or ACE) descriptive objects ("ADOs") in the exemplary embodiment, and which preferably function as "objects" within the method of the invention, as objects are generally defined and used in object oriented programming languages and systems.

In the exemplary embodiment, the algorithm, function or program selection or generation step 305 is conducted using a comparatively high-level language, such as the C or C++ programming languages, or the "Q" language which is the subject of a related patent application. For example, a given algorithm or function may be programmed in C, C++ or Q. Alternatively, there may be existing C or C++ programs, and even engineering standards expressed in C or C++, which are or have been selected for execution on an ACE 100 or other adaptive computing circuit. Such programs or code, especially legacy code designed for execution on a processor, are not necessarily optimized for execution on an ACE 100 or other adaptive computing circuit. As a consequence, the selected programs or algorithms of step 305 are then profiled and optimized for comparatively optimal execution an ACE 100 or other adaptive computing circuit in step 315. For selected programs or algorithms of step 305 which have already been designed or developed for an adaptive computing circuit such as the ACE 100, the method may proceed directly to step 335 (bypassing the profiling and other intervening steps 315, 320, 325 and 330).

The profiling of step 315 analyzes the program code or other algorithm based upon a plurality of data parameters (or data metrics), with identification of the corresponding algorithmic element. While profiling on the basis of data parameters is the subject of another related patent application, the plurality of data parameters may comprise one or more of the following parameters, in addition to other forms of data measurement:

data location (for static data), such as a memory or register location;

data type, such as input data, intermediate calculation data, output data, other forms of operand data, and so on;

data size (input and output), such as number of bits, bandwidth required (bus or interconnect width), which may also be a function of or otherwise related to data type;

data source and destination locations (for dynamic data), such as memory or register locations;

data pipeline length, such as how long a data stream is;

locality of reference, such as how far the data is from the computing elements which will process or use it;

distance of data movement (for dynamic data), such as a distance between various caches, registers, or other memory locations, and/or the distance the data moves between or among the lines of code being profiled;

speed of data movement (for dynamic data), namely, how fast was the data able to be moved from a source location to a computing element and/or to a destination location, such as the number of computation cycles utilized in the data transfer;

data access frequency, such as how often was the data accessed;

data loads and stores (load/stores) into registers, caches or other memory;

degree of cache, register or memory usage; and data persistence, such as how long did the data remain in use, either unchanged or as (repeatedly) modified and used.

Based upon the results of profiling using the data parameters (i.e., profiled data parameter results or measured data parameters), portions of the profiled code are selected for execution on the adaptive computing architecture, step 320. The profiling statistics are calculated iteratively in the exemplary embodiment, as portions of code are identified as capable of acceleration in the ACE hardware, and subsequently removed from the program code. The profiling process is repeated until optimal performance of the configuration and the ACE architecture is achieved, step 325. Those of skill in the art will realize that this iterative profiling process may also be expressed through one or more other conditional statements or expressions. In addition, those of skill in the art will also recognize that other forms of profiling may also be utilized, in lieu of or in addition to the exemplary data profiling of the present invention, and are within the scope of the present invention.

In the exemplary embodiment, data parameters for the profiling of step 315 include one or more of the following attributes, as mentioned above: data location (for static data), data type, data size (input and output), data source and destination locations (for dynamic data), data pipeline length, locality of reference, distance of data movement, speed of data movement, data access frequency, number of data load/stores, degree of cache, register or memory usage, and data persistence.

In the exemplary embodiment, all of the algorithm or program is ultimately selected for execution in the adaptive computing circuit, such as the ACE 100. In other embodiments, however, portions of the algorithm or program which may not be selected for execution in the ACE 100 in step 320 may be selected for execution in a processor, such as a RISC processor, step 330, when such a processor is available or desirable in the selected embodiment.

Following step 305 or step 325, the algorithms, functions or programs for execution on an adaptive computing circuit, such as the ACE 100, are then "scheduled" in step 335, as discussed in greater detail below.

Independently of steps 305 and 315 through 330, the "hardware" descriptions are generated in step 310, preferably as adaptive computing (ACE) descriptive objects (ADOs). Step 310 may occur at any time, such as before, concurrently with or subsequent to steps 305 and 315 through 330. In the exemplary embodiment, a plurality of adaptive computing descriptive objects are defined and generated using a comparatively high-level language such as Java, and are stored in a library or other database for subsequent use in the method, such as in steps 335, 340 and 345, discussed below. Such adaptive computing descriptive objects, for example, may describe an adder, its inputs and outputs, a register file and its inputs and outputs, and how the adder and register file are to be connected to each other. Such ADOs are generated for every type of computational element, and the number of such ADOs is generally only limited by the number of matrices 150 which are to be available in the IC. In general, an adaptive computing descriptive object should include a description of the desired function (such as addition or multiplication), with description of its inputs and outputs, such as 16 or 32 bit I/O; in the exemplary embodiment, an ADO further includes a description of memory resources for operand and result data (such as a register file) and its I/O, and desired connections between the desired function and corresponding memory resources. In the exemplary embodiment, step 310 is implemented through a descriptive object "creator" process, which may convert higher-level descriptions into adaptive computing descriptive objects.

The adaptive computing descriptive objects may then be selected and combined into various groups or sets to perform various functions or algorithms; in the exemplary embodiment, this selecting and combining is performed during the scheduling process of step 335, as discussed in greater detail below. This scheduling process is also discussed in greater detail in the second related application. The various combinations of these adaptive computing descriptive objects which are selected, ultimately then form or comprise corresponding, multiple versions of adaptive computing circuitry, for use in steps 335 and 340. These adaptive computing circuit versions will vary depending upon the selected operating modes of the ACE 100 and the algorithms or functions the adaptive computing circuit is to perform. As discussed in greater detail below, these adaptive computing circuit versions may also differ according to their operational feature set, or optimization for various goals, such as comparatively low power consumption, comparatively low latency, bandwidth, comparatively high speed, and versatility for performance of a plurality of operating modes or algorithms. In the exemplary embodiment, an adaptive computing circuit version is generated through an iterative scheduling process (of step 335), which selects one or more ADOs for the performance of an algorithmic or functional element, maps the algorithmic elements to corresponding adaptive computing descriptive objects for execution, and provides corresponding timing information for execution of the algorithmic element on the selected hardware, as discussed in greater detail below.

As indicated above, the scheduling process of step 335 (also referred to and embodied as a "scheduler" of FIG. 4) receives, as input, a series of algorithmic or functional elements from the selected algorithm or program (from step 305 or from steps 320 and 325), which are to be performed on an adaptive computing circuit. The scheduling process of step 335 also receives, as input, the library (or database) of adaptive computing descriptive objects (from step 310). The scheduling process (of step 335) then matches or maps an algorithmic or functional element to an adaptive computing descriptive object, for execution (when the ADO is converted to an IC), generating multiple adaptive computing circuit versions (step 340). For example, the scheduling process may map a 32-bit add in an algorithm to two 16-bit adders (as described as ADOs), with corresponding MIN 110 connections, for simultaneous execution. In another iteration, to optimize the ACE 100, the scheduling process may map a 64-bit add in an algorithm to four 16-bit adders (as described as ADOs), with corresponding MIN 110 connections, also for simultaneous performance. In addition, the exemplary scheduler is designed to recognize when various algorithms may be executed in parallel, rather than sequentially, and allocate ADOs accordingly. This scheduling process continues in an iterative fashion (illustrated with a double arrow notation between steps 335 and 340 in FIG. 3), matching algorithmic elements to available ADOs in the various different (and potentially changing) adaptive computing circuit versions. It should be noted, more specifically, that during these iterations, using available ADOs, multiple and different ACE circuit version may be generated in the scheduling process, producing a plurality of adaptive computing circuit versions, step 340, which may be optimized or adapted for different IC goals, such as high speed or minimizing power consumption.

One of the aims of the scheduling process of step 335 is to achieve a one-to-one correspondence between each algorithmic element and a computational element 250 needed to execute the algorithmic element. Furthermore, algorithmic elements may be scheduled with ADOs to reduce power consumption and/or latency, or to reduce bandwidth required for data movement across processes. The scheduler is also designed to recognize potentially competing resources, and to iteratively optimize the performance of the algorithm or program on a potential ACE circuit version, utilizing the plurality of ACE circuit versions which have been iteratively generated and which are thereby available, ultimately selecting one ACE circuit (or hardware) version as optimal or acceptable in light of the selected algorithms, available resources, competing operating modes, versatility, power consumption, latency, bandwidth, speed of operation, and the other considerations mentioned above, step 340. As a consequence, the scheduler of step 335 coordinates available adaptive computing (hardware) resources, over time, with the processes to be performed for the selected operating mode, generating the selected adaptive computing circuit version, with a corresponding scheduled algorithm or program for performance of the desired operating mode of the adaptive computing circuit.

In the exemplary embodiment, information is also output from the scheduling process and may be utilized to generate static reports, step 365, such as resource utilization reports (e.g., number and type of computational elements 250), and may be run through a simulation process (step 370), generating a dynamic report, such as describing power utilization, speed, bandwidth, and so on, step 375. These various reports may be used, for example, for evaluation purposes, and additional input may be provided back into the scheduler of step 335 to further optimize the adaptive computing circuit.

Once the scheduling process (or the various reports) indicate no comparatively greater opportunity or need for optimization of the selected circuit version (of step 340), the selected adaptive computing circuit version is converted into a hardware description, step 345, using a hardware description language as known in the field (such as Verilog), and ultimately fabricated to produce an ACE 100 or other adaptive computing integrated circuit corresponding to the selected circuit version, step 355.

The scheduling process of step 335 also provides an output indicating which computational elements 250 are in use in the adaptive computing circuit (such as the ACE 100), when, and how they are connected, i.e., an output of a scheduled algorithm or program for providing an operating mode to the selected adaptive computing circuit. This information is then compiled (converted or assembled) in step 350 into configuration information corresponding to the algorithmic element as scheduled for execution on selected computational elements 250. In the exemplary embodiment, the configuration information is an adaptive computing circuit (ACE) bit file, such as a stream or packet of bits which indicate, throughout the entire adaptive computing (ACE 100) circuit, the state (such as an initial state and any state changes) of various multiplexers, demultiplexers, or switches, which turn on or off different paths of interconnect (MIN), for connecting and reconnecting various computational elements, for routing of operand data and results, and for routing of configuration information within the IC. The resulting configuration information may then be compiled and/or loaded into one or more fabricated adaptive computing circuits, step 360, and the process may end, return step 380.

There are particularly novel features of the method illustrated in FIG. 3. First, the method provides control over the entire process of adaptive computing circuit development, from algorithm to loading a configuration bit file into an ACE 100.

Second, the method enables the creation of multiple versions of configuration information, for a selected operating mode, corresponding to either different hardware versions (used in step 340 to select an optimal version), or a different (operational) feature set of an ACE 100 circuit. For example, suppose three separate adaptive computing circuit versions are fabricated, hardware version 1, hardware version 2, and hardware version 3, each with different computational capabilities. The various adaptive computing circuit versions may have been optimized for different goals such as, for example, minimizing power consumption, maximizing speed of operation, minimizing cost, minimizing latency, maximizing versatility for having multiple operating modes, and so on. Each version, however, at a minimum will have a CDMA mobile communications operating mode, for this example. As a consequence, the scheduling and compiling of configuration information (of, respectively, steps 335 and 350) may generate corresponding sets of configuration information, enabling each hardware version to have the corresponding operating mode, with potentially differing operational feature sets (or more simply, feature sets), for the hardware version's given capabilities. Different feature sets (for an operating mode such as CDMA mobile communications) may include, for example, different memory and dialing list capability, different automatic dialing options, different alerting (ringing) options, different data transmission capabilities, and any other similar capabilities, such as feature sets for other potential operating modes such as paging, message display, electronic mail (email), or internet access capability. (It should be noted that depending upon the degree of convergence of multiple technologies, distinctions between an operating mode and a feature set may easily be blurred; for example, a CDMA mobile station may also include a paging function as part of its feature set, which would otherwise be an operating mode in a stand-alone pager.)

Continuing with the example, each of these hardware versions may then acquire additional operating modes, and have different capabilities or versatility for having additional operating modes. For example, hardware version 1 may also be capable of and select a GSM mobile communications operating mode and MP3 music playing capacity, while hardware versions 2 and 3 may be capable of only an additional MP3 music playing operating mode (given the now pre-existing CDMA operating mode). Multiple variations are clearly possible, especially given that new operating modes may be acquired, with or without retention of previous or pre-existing operating modes. Again, in light of the capabilities of each hardware version and its other operating modes (as competing for the same resources), the scheduling and compiling of configuration information steps 335 and 350 may generate corresponding sets or versions of configuration information, enabling each hardware version to have the corresponding operating mode, such as GSM or MP3, also with potentially differing feature sets, and also for the hardware version's given capabilities.

Third, and especially useful, an entire library or database of these versions of configuration information may be created in advance or in real time, based upon any one or more of a plurality of selection parameters, such as for each desired operating mode, for each hardware version, for each selected feature set, and in light of pre-existing or competing operating modes. In addition, additional versions may also be created for different operating conditions, such as power consumption, latency, and bandwidth considerations. A library of such versions (as "multiple binaries") may be stored in multiple locations, such as on a network server, in a base station transceiver, or in another intelligent network device (such as an intelligent peripheral, a service circuit node, and so on), for download into a given ACE 100 by a corresponding service provider.

Fourth, all of the various processes may run off a single set of descriptions, the adaptive computing descriptive objects (or ADOs), for any number of different operating modes, with corresponding algorithms bound to the hardware through the scheduling process.

Fifth, the process is dynamic, with selected changes available when the configuration information is compiled or assembled into a corresponding bit file for loading into the ACE 100.

An exemplary system embodiment 400 in accordance with the present invention is illustrated in FIG. 4, and also provides a useful summary. Preferably, the system 400 is embodied as or included within one or more computers, engineering workstations, servers, a collection of networked computers, or other computing devices, with some or all of the various processes of the method of the invention (discussed above) embodied or included as programs, code or configuration information, for execution therein, or included equivalently, such as "hard wired" in an ASIC. The invention may be embodied as any type of software (e.g., for use in a system 400), such as C, C++, C#, Java, or any other type of programming language, including embodiment as configuration information (as a form of software) to direct a configuration within an adaptive computing architecture to perform the various development functions of the invention. The invention may be embodied within any tangible storage medium, such as within a memory or storage device for use by a computer, a workstation, any other machine-readable medium or form, or any other storage form or medium for use in a computing system to develop adaptive computing circuitry and corresponding configuration information. Such storage medium, memory or other storage devices may be any type of memory device, memory integrated circuit ("IC"), or memory portion of an integrated circuit (such as the resident memory within a processor IC or ACE 100), including without limitation RAM, FLASH, DRAM, SRAM, SDRAM, MRAM, FeRAM, ROM, EPROM or E$^2$PROM, or any other type of memory, storage medium, or data storage apparatus or circuit, depending upon the selected embodiment. For example, without limitation, a tangible medium storing computer or machine readable software, or other machine-readable medium, is interpreted broadly and may include a floppy disk, a CDROM, a CD-RW, a magnetic hard drive, an optical drive, a quantum computing storage medium or device, a transmitted electromagnetic signal (e.g., a computer data signal embodied in a carrier wave used in internet downloading), or any other type of data storage apparatus or medium, and may have a static embodiment (such as in a memory or storage device) or may have a dynamic embodiment (such as a transmitted electrical signal), or their equivalents.

Referring to FIG. 4, the system 400, in general, receives input of an algorithm or program (405) for modification in accordance with the invention for use on an adaptive computing circuit 415, and input of adaptive computing descriptive objects (ADOs) 420 from an adaptive computing descriptive object generator 410. Alternatively, the adaptive computing descriptive objects generator 410 may also be included within the system 400, and for such an embodiment, the received input is generally a set of IC specifications, such as a specification of the number of matrices, a maximum number of types of computation elements, and any other limitations to be imposed on the resulting adaptive computing IC 415. The input or generated adaptive computing descriptive objects 420 are preferably stored in a memory 425, which may be any form of memory IC or information storage device, of any kind, as indicated above. The algorithm or program 405 is preferably input into a profiler 430, for profiling as discussed above; depending upon the type of algorithm or program 405 which is input, profiling may not be needed and, in such case, the algorithm or program 405 may be input directly into a scheduler 435.

Continuing to refer to FIG. 4, the scheduler 435, in turn, as discussed above (step 335), schedules the algorithm or program 405 with the adaptive computing descriptive objects 420, to iteratively produce and optimize the adaptive computing architecture versions 440, which are also stored in memory 425. When an optimal adaptive computing architecture version has been achieved, with the corresponding scheduled algorithm or program, the scheduler 435 outputs this information to simulator and report generator 455, configuration information compiler 450, and the hardware description language generator 445. The configuration information compiler 450 produces the configuration information, as an adaptive computing circuit (ACE) bit file, corresponding to the scheduled algorithm, for the selected, preferably optimized, adaptive computing architecture version, as discussed above. The hardware description language generator 445 produces a hardware language description of the selected adaptive computing architecture version, while the simulator and report generator 455 simulates, and generates corresponding reports for, the selected adaptive computing architecture version as it is run with the compiled configuration information. The hardware language description of the selected adaptive computing architecture version may then be provided to a fabricator 460 for production of the corresponding adaptive computing IC 415 (such as an ACE 100). The compiled configuration information may be provided to one or more service providers, such as configuration information provider 465, for ultimate loading into the adaptive computing IC 415.

Numerous advantages of the present invention are readily apparent. The invention provides control over the entire design and development process, from algorithm to loading a configuration bit file into an ACE 100. The invention enables the creation of multiple versions of configuration information for an adaptive computing circuit, for one or more selected operating modes, corresponding to different hardware versions, different feature sets, different operating conditions, and pre-existing operating modes. An entire library or database of these versions of configuration information may be created in advance or in real time, for each desired operating mode, for each hardware version, for each selected feature set, and in light of pre-existing or competing operating modes. In addition, additional versions may also be created for different operating conditions, such as power consumption, latency, and bandwidth considerations. A library of such versions (as "multiple binaries") may be stored in multiple locations, such as on a network server, for download into a given adaptive computing circuit by a corresponding service provider. All of the various processes of the present invention may run off a single set of descriptions, the adaptive computing descriptive objects (or ADOs), for any number of different operating modes, with corresponding algorithms bound to the hardware through the scheduling process. Lastly, the process is dynamic, with selected changes available when the configuration information is compiled or assembled into a corresponding bit file for loading into the adaptive computing circuit.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

We claim:

1. A method for providing a selected operating mode for an adaptive circuit to achieve a specified performance objective, the adaptive circuit including a plurality of heterogeneous computing elements which are adapted to being coupled to each other by a reconfigurable interconnection network, each of the heterogeneous computing elements performing a corresponding computation, configuration information configuring interconnection network to interconnect one or more heterogeneous computing elements of the adaptive circuit to perform a function, the method comprising:
   (a) producing a plurality of configuration information versions for the adaptive circuit, each of the configuration information versions providing the selected operating mode for the adaptive circuit;
   (b) selecting a configuration information version of the plurality of configuration information versions, to achieve the specified performance objective;
   (c) providing the selected configuration information version for use in the adaptive circuit; and
   (d) configuring the adaptive circuit with the selected configuration information version via the interconnection network.

2. The method of claim 1, wherein the selecting configuration information version further comprises: selecting the configuration information version using a plurality of selection parameters, the plurality of selection parameters comprising at least two of the following selection parameters: a competing operating mode, versatility for a plurality of operating modes, a selected operational feature set of a plurality of operational feature sets, selected operating conditions of a plurality of operating conditions, and a selected adaptive circuit version of a plurality of adaptive circuit versions.

3. The method of claim 1, wherein the producing a plurality of configuration information versions further comprises:
   selecting an algorithm for performance by the adaptive circuit;
   determining a plurality of adaptive computing descriptive objects;
   scheduling the algorithm with the plurality of adaptive computing descriptive objects to produce a scheduled algorithm and a selected adaptive circuit version; and
   from the scheduled algorithm and the selected adaptive circuit version, generating the plurality of configuration information versions for the performance of the algorithm by the adaptive circuit, the adaptive circuit corresponding to the selected adaptive circuit version.

4. The method of claim 3, wherein each adaptive computing descriptive object of the plurality of adaptive computing descriptive objects comprises a description of a function, an input for the function, an output for the function, a description of a memory resource for the function, an input for the memory resource, an output for the memory resource, and a connection between the function and the memory resource.

5. The method of claim 4, wherein a selected adaptive computing descriptive object, of the plurality of adaptive computing descriptive objects, describes a function of a plurality of functions, the plurality of functions comprising at least two of the following functions: a plurality of linear operations, a plurality of non-linear operations, a plurality of finite state machine operations, a plurality of control sequences, a plurality of bit level manipulations, memory, and memory management.

6. A system for providing a selected operating mode for an adaptive circuit to achieve a specified performance objective, the adaptive circuit including a plurality of heterogeneous computing elements which are adapted to being coupled to each other by a reconfigurable interconnection network, each of the heterogeneous computing elements performing a corresponding computation, wherein configuration information configures the interconnection network to interconnect one or more heterogeneous computing elements of the adaptive circuit to perform a function in an operating mode, the system comprising:

means for producing a plurality of configuration information versions for the adaptive circuit, each of the configuration information versions configuring the adaptive circuit to perform the selected operating mode;

means for selecting a configuration information version of the plurality of configuration information versions, to achieve the specified performance objective; and means for providing the selected configuration information version for use in the adaptive circuit; and means for configuring the adaptive circuit with the selected configuration information version via the interconnection network.

7. The system of claim 6, wherein the means for selecting a configuration information version further comprises: means for selecting the configuration information version using a plurality of selection parameters, the plurality of selection parameters comprising at least two of the following selection parameters: a competing operating mode, versatility for a plurality of operating modes, a selected operational feature set of a plurality of operational feature sets, selected operating conditions of a plurality of operating conditions, and a selected adaptive circuit version of a plurality of adaptive circuit versions.

8. The system of claim 6, wherein the means for producing a plurality of configuration information versions further comprises:

means for selecting an algorithm for performance by the adaptive circuit;

means for determining a plurality of adaptive computing descriptive objects;

means for scheduling the algorithm with the plurality of adaptive computing descriptive objects to produce a scheduled algorithm and a selected adaptive circuit version; and means for generating the plurality of configuration information versions, from the scheduled algorithm and the selected adaptive circuit version, for the performance of the algorithm by the adaptive circuit, the adaptive circuit corresponding to the selected adaptive circuit version.

9. The system of claim 8, wherein each adaptive computing descriptive object of the plurality of adaptive computing descriptive objects comprises a description of a function, an input for the function, an output for the function, a description of a memory resource for the function, an input for the memory resource, an output for the memory resource, and a connection between the function and the memory resource.

10. The system of claim 9, wherein a selected adaptive computing descriptive object, of the plurality of adaptive computing descriptive objects, describes a function of a plurality of functions, the plurality of functions comprising at least two of the following functions: a plurality of linear operations, a plurality of non-linear operations, a plurality of finite state machine operations, a plurality of control sequences, a plurality of bit level manipulations, memory, and memory management.

* * * * *